(12) United States Patent
Gebbie et al.

(10) Patent No.: US 7,277,804 B2
(45) Date of Patent: Oct. 2, 2007

(54) METHOD AND SYSTEM FOR PERFORMING EFFECTIVE RESISTANCE CALCULATION FOR A NETWORK OF RESISTORS

(75) Inventors: Ian Gebbie, Edinburgh (GB); Ian Dennison, Edinburgh (GB); Zsolt Haag, Glasgow (GB); Keith Dennison, Edinburgh (GB)

(73) Assignee: Cadence Design Systems, Inc., San Jose, CA (US)

( * ) Notice: Subject to any disclaimer, the term of this patent is extended or adjusted under 35 U.S.C. 154(b) by 44 days.

(21) Appl. No.: 11/134,803

(22) Filed: May 20, 2005

(65) Prior Publication Data

US 2005/0288914 A1  Dec. 29, 2005

Related U.S. Application Data

(60) Provisional application No. 60/584,326, filed on Jun. 29, 2004.

(51) Int. Cl.
*G01R 25/00* (2006.01)
*G06F 17/50* (2006.01)

(52) U.S. Cl. .......................................... 702/65; 703/14
(58) Field of Classification Search ................ 702/65, 702/57–58, 64; 703/14, 13; 324/600, 457, 324/500, 522, 537, 549, 691, 713
See application file for complete search history.

(56) References Cited

U.S. PATENT DOCUMENTS

| | | | | |
|---|---|---|---|---|
| 5,943,487 A | * | 8/1999 | Messerman et al. | .......... 716/11 |
| 6,897,761 B2 | * | 5/2005 | Ernsberger et al. | ......... 338/309 |
| 6,978,214 B2 | * | 12/2005 | Budell et al. | ................. 702/65 |
| 7,039,888 B2 | * | 5/2006 | Steinmann et al. | ............ 716/5 |

OTHER PUBLICATIONS

Glez Harbour et al., Calculation of Multiterminal Resistances in Integrated Circuits, 1986 IEEE Transactions on Circuits and Systems, vol. CAS-33, No. 4, pp. 462-465.*

Zhao et al., Estimation of Inductive and Resistive Switching Noise on Power Supply Network in Deep Sub-micron CMOS Circuits, 2000 IEEE, pp. 65-72.*

Stark et al., Techniques for Calculating Currents and Voltages in VLSI Power Supply Networks, Feb. 1990 IEEE Transactions on Computer-Aided Design, vol. 9, No. 2, pp. 126-132.*

Cadence "Parasitic Simulation User Guide" Product 4.4.6, Jun. 2003, Cadence Design Systems, Inc., USA.

Cadence "Ultrasim User Guide" Product Version 3.3, Oct. 2003, Cadence Design Systems, Inc., USA.

O'Brien, P.R. et al. "Modeling the Driving-Point Characteristic of Resistive Interconnect for Accurate Delay Estimations" Proceedings of the 1989 IEEE International Conference on Computer-Aided Design (ICCAD-89), Nov. 5-9, 1989, pp. 512-516.

Rao, V. et al. "Aggressive Crunching of Extracted RC Netlists", Proceedings of the 8th ACM/IEEE International Workshop on Timing Issues in the Specification and Synthesis of Digital Systems, Monterey, CA, 2002, pp. 70-77.

Rao, V. et al. "Aggressive Crunching of Extracted RC Netlists", 2002, pp. 1-32, located at www.tauworkshop.com/TauSlides/4.5. ppt.

Sheehan, B.N. "TICER: Realizable Reduction of Extracted RC Circuits" Proceedings of the 1999 IEEE/ACM International Conference on Computer-Aided Design (ICCAD'99), San Jose, CA, 1999, pp. 1-4.

\* cited by examiner

*Primary Examiner*—Donald E. McElheny, Jr.
*Assistant Examiner*—Toan M. Le
(74) *Attorney, Agent, or Firm*—Bingham Mccutchen LLP

(57) ABSTRACT

A method, mechanism, and system for determining an effective resistance for a network of resistors, irrespective of the number of terminals is provided. An aspect of an approach relates to the reduction of any network of resistors to a single resistance value. Another aspect of an approach relates to the application of a power loss calculation to determine the effective resistance. Yet another aspect of an approach relates to the integration of the method/mechanism with an analog simulator.

56 Claims, 7 Drawing Sheets

METHOD AND SYSTEM FOR PERFORMING EFFECTIVE RESISTANCE CALCULATION FOR A NETWORK OF RESISTORS

CROSS-REFERENCE TO RELATED APPLICATIONS

This application claims the benefit of U.S. Provisional Application No. 60/584,326, filed on Jun. 29, 2004, which is hereby incorporated by reference in its entirety as if fully set forth herein.

BACKGROUND AND SUMMARY

The field of the invention relates to a method and mechanism for calculating and comparing the resistance values for networks of resistors.

It is often desirable for circuit designers to be able to view/visualize networks of resistors as a single equivalent resistance value. For example, in order for analog designers to compare the resistances of networks of resistors and to enable the identification of "hot spots" of resistance, it is useful to reduce the resistive complexity of their designs, which may consist of both resistors added by the designers as well as the large number of resistors introduced as a by-product of IC physical layout and extraction of the design. In the case of parasitic extraction, a single net as entered in the schematic design is transformed into a network of parasitic resistors. In order to visualize/compare these post-extraction networks, it can be necessary to collapse these networks into single equivalent resistors.

For a network of resistors with two external terminals, this single equivalent resistance is the resistance between one external terminal and the other, which can be obtained using Ohm's law, or other techniques such as topological, or mathematical reduction. In the case of topological reduction, using traditional reduction via series parallel, and delta-star transformations, there is no single solution for a multi-terminal net, since these reductions are based on transformations for two-terminal networks. Using this technique on a multi-terminal network, can reduce the number of resistors, but will still result in a network of resistors, typically a resistor between each terminal pair. As such, while these approaches may reduce the number of resistors in the circuit, they do not reduce the number of terminals on the network, subsequently preventing them from being used to arrive at a single resistance value for the network.

Existing research and implementations of topological and mathematical network reducers are aimed at reducing the complexity of the resistance network for simulation purposes, not for visualization or comparison purposes. The main limitation of mathematical reduction techniques is that they do not remove any external terminals of the network. There have been proposed reducers which do discard external terminals, but these do this by shorting terminals together that do not affect the accuracy of the results significantly. In order to reduce to a single resistor, one would have to accept a very low accuracy result.

To address these and other problems with prior solutions, embodiments of the invention describe a technique, and implementation for arriving at such a single value for the effective resistance for a network of resistors, irrespective of the number of external terminals. An aspect of an embodiment comprises the reduction of any network of resistors to a single resistance value. Another aspect comprises the application of the power loss calculation to determine the effective resistance. Yet another aspect comprises integration of the method/mechanism with an analog simulator Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The accompanying drawings are included to provide a further understanding of the invention and, together with the Detailed Description, serve to explain the principles of the invention. The same or similar elements between figures may be referenced using the same reference numbers.

DETAILED DESCRIPTION

Embodiments of the invention describe a technique, and implementation for arriving at such a single value for the effective resistance for a network of resistors, irrespective of the number of external terminals.

Figure 1:
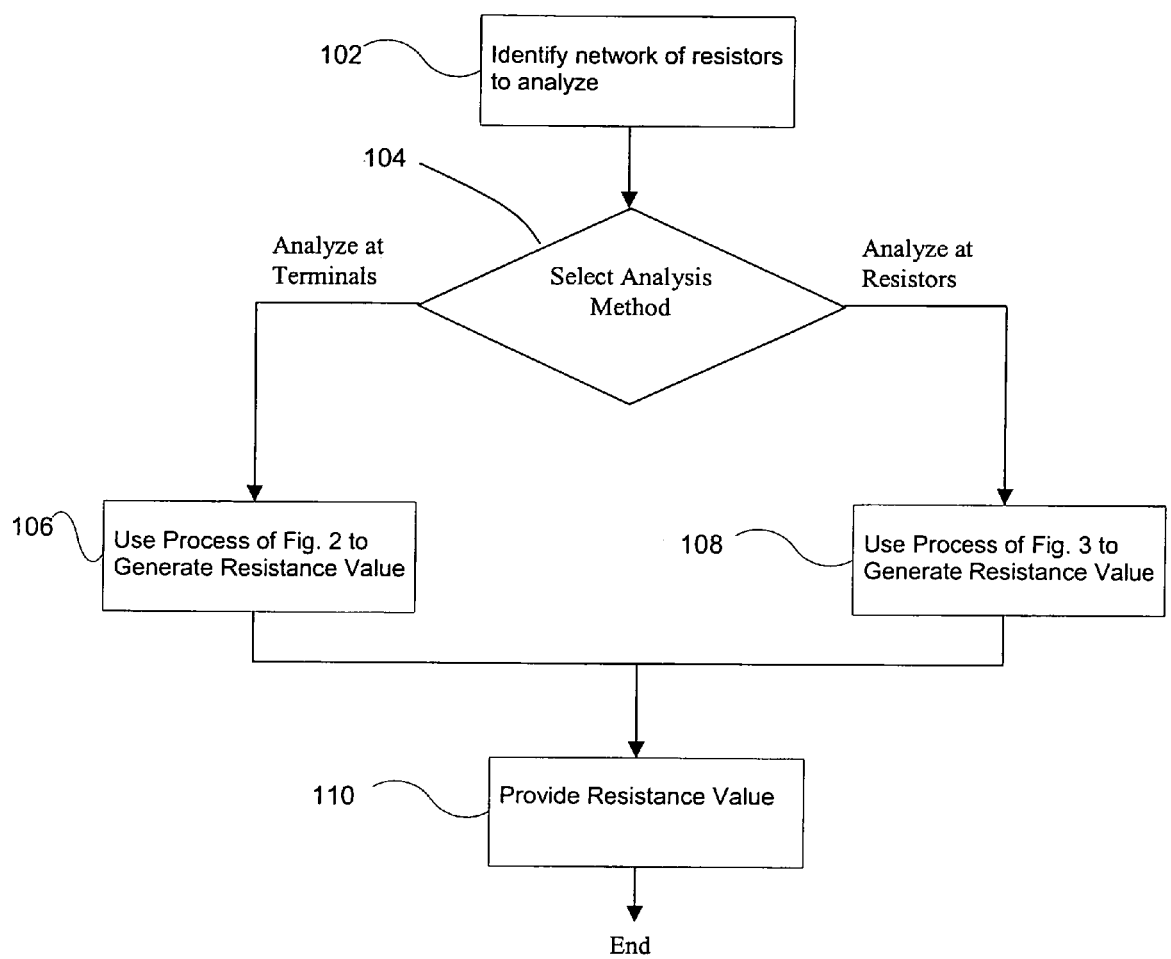
FIG. 1 shows a flowchart of a process for calculating an effective resistance value for a network of resistors according to an embodiment of the invention.

FIG. 1 is a flowchart showing an overview of a process for calculating a resistance value for a network of resistors according to an embodiment of the invention. At 102, the process identifies a network of resistors to analyze. For this action, there are different options available with respect to the circuit granularity for which analysis is desired as well as the context in which the process is performed.

Figure 5:
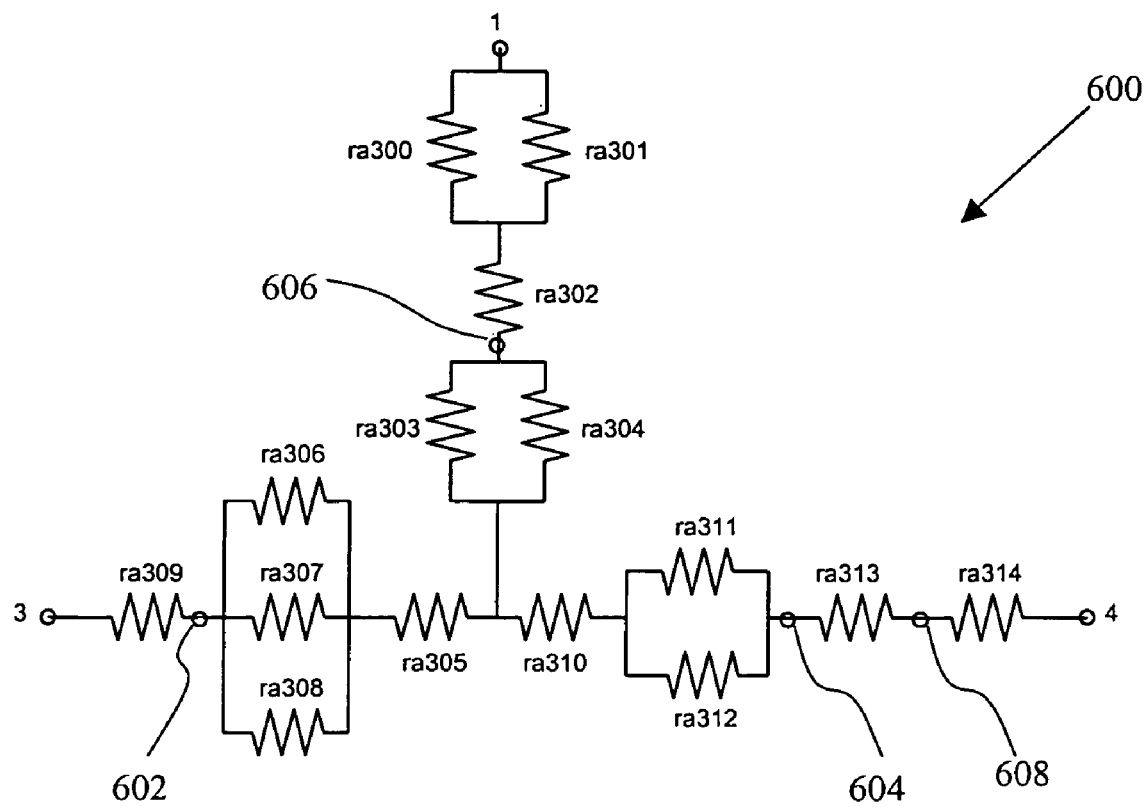
FIG. 5 illustrates an example resistor network.

With respect to granularity, the present process may be applied to any resistive network, regardless of its size and number of terminals. Therefore, any granular level of a circuit design may be analyzed, including the network of resistors for an entire circuit design, as well as any subset of resistors within the overall network. For example, FIG. 5 shows an example resistive network 600 having terminals 1, 3, and 4. The entire network 600 of resistors defined by terminals 1, 3, and 4 may be analyzed to calculate a single composite resistance value. Alternatively, the disclosed invention may be applied to determine the effective resistance value for any subset of resistors within this network 600, e.g., the subset defined by points 602, 604, and 606.

With respect to context, the present embodiment of the invention may be applied to create a single effective resistance value for a circuit for any circuit design/implementation purpose/context. Example contexts in which the invention may be applied are to allow analog designers to compare the resistances of networks of resistors, to allow IC designers to evaluate the large number of resistors introduced as a by-product of IC physical layout and extraction of the design, and to enable visualization/comparison of post-extraction networks. The invention can also be used in the iterative process to modify the layout of a design to overcome system and parasitic effects seen during parasitic re-simulation. Parasitics for physical layout of nets at each iteration can be more easily compared by performing the invention to reduce per-net parasitics to a single resistance value, removing complex differences that will occur within the parasitic networks for the net as a result of each round of changes to the layout of the design (e.g., for a net and others that influence it). The invention may also be applied to determine an effective resistance value for a PCB design.

Once a network of resistors has been identified for analysis, the next action at 104 is to select an analysis method to use to evaluate the circuit. The present embodiment provides two example approaches for analyzing the circuit.

A first example approach is to analyze the circuit based upon circuit values at each external terminal. For example, if the analysis is performed upon the entire network 600 in FIG. 5, this means performing the analysis based upon circuit values measured at external terminals 1, 3, and 4. With this approach, the process described with respect to FIG. 2 is employed to calculate the effective resistance value (action 106 of FIG. 1).

A second example approach is to is to analyze the circuit based upon circuit values at each resistor within the network. If this type of analysis is performed upon the entire example network 600 of FIG. 5, this can be accomplished by measuring circuit values across each resistor within the network. Each such resistor in the network is analyzed to calculate the effective resistance value (action 108 of FIG. 1).

Once the process has calculated the effective resistance value for the network, that value is returned to the calling entity, e.g., the calling program or user (110).

Figure 2:
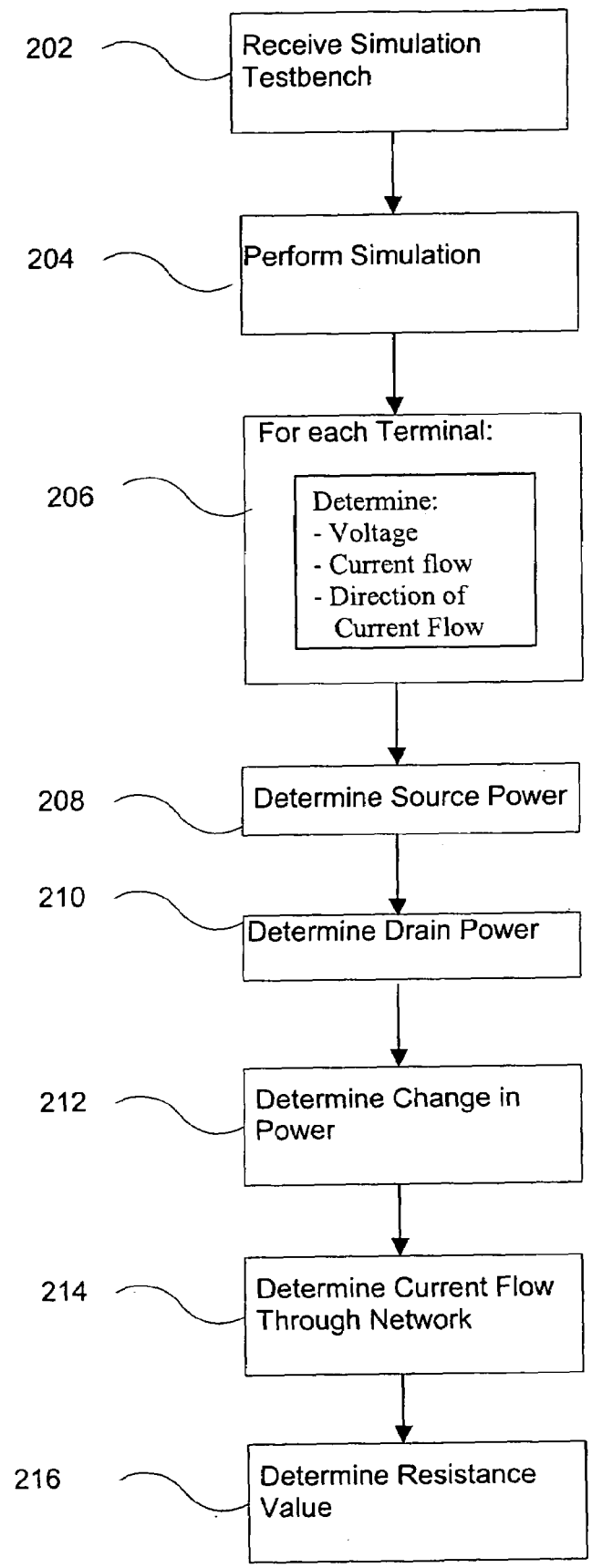
FIG. 2 shows a flowchart of a process for calculating an effective resistance value based upon measurements at external terminals according to an embodiment of the invention.

FIG. 2 shows a flowchart of a process for calculating an effective resistance value for a network of resistors based upon circuit values at each external terminal of the network according to an embodiment of the invention. To facilitate the explanation of FIG. 2, the present description will from time to time refer to the example pictorial representation of a resistor network 400 shown in FIG. 4.

The process of FIG. 2 begins by receiving a simulation testbench that is appropriate for the resistor network 400 that is presently under analysis (202). The simulation testbench is used to stimulate all required portions of the resistor network 400. Any suitable approach may be employed to generate the simulation testbench. An exemplary commercial product that may be employed to generate a simulation testbench is the Testbuilder product, available from Cadence Design Systems, Inc. of San Jose, Calif.

Figure 4:
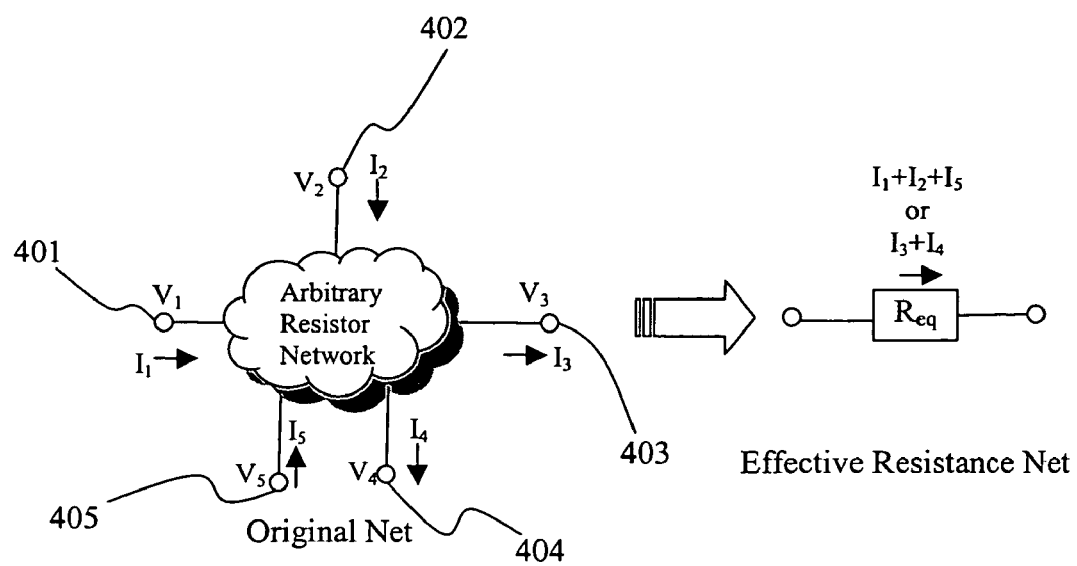
FIG. 4 illustrates a pictorial representation of a process for calculating an effective resistance value for a network of resistors according to an embodiment of the invention.
Figure 4:
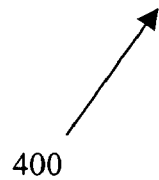

At 204, simulation is performed upon the resistor network 400 using the simulation testbench that was received at 202. This action runs an analog DC simulation (if the context in which the invention is used involves an analog designer seeking to analyze an analog circuit). Based upon the simulation, the process determines the voltage, current flow, and direction of current flow at each external terminal of the network 400 (206). In the example of FIG. 4, the network 400 includes five terminals 401, 402, 403, 404, and 405. Based upon action 206, the process determines voltage $V_1$ and current $I_1$ for terminal 401, as well as determining the direction for current $I_1$. Similarly, for each of the other external terminals, the process determines voltage $V_2$, current $I_2$, and current direction for terminal 402, voltage $V_3$, current $I_3$, and current direction for terminal 403, voltage $V_4$, current $I_4$, and current direction for terminal 404, and voltage $V_5$, current $I_5$, and current direction for terminal 405.

At 208, the process determines the source power by summing the power for all source terminals. The following equation can be used to make this determination:

$$P_s = \sum_s V_s I_s \qquad \text{Equation 1}$$

In the example of FIG. 4, it can be seen from the direction of the currents from the external terminals that terminals 401, 402, and 405 correspond to source terminals. Therefore, the source power $P_S$ for example network 400 is calculated by summing the power for each external terminal 401, 402, and 405.

At 210 of FIG. 2, the process determines the drain power by summing the power for all drain terminals. The following equation can be used to make this determination:

$$P_d = \sum_d V_d I_d \qquad \text{Equation 2}$$

In the example of FIG. 4, it can be seen from the direction of the currents from the external terminals that terminals 403 and 404 correspond to drain terminals. Therefore, the drain power $P_d$ for example network 400 is calculated by summing the power for each external terminal 403 and 404.

At 212 of FIG. 2, the process calculates the change in power, or power loss, within the resistor network. This can be calculated by subtracting the drain power $P_d$ from the source power $P_s$. The following equation can be used to make this determination:

$$\Delta P = P_s - P_d \qquad \text{Equation 3}$$

At 214, the process determines the overall current flow through the resistor network. To determine the network current I, Kirchoff's Current Law (KCL) is used. It states that the currents into/out of a circuit must be equal; therefore the current flow through the equivalent resistor is either the sum of all the currents into the circuit or out of the circuit. This value can be calculated by summing the current flowing through either the source terminals or the drain terminals. In the example of FIG. 4, the source terminals are 401, 402, and 405 and the drain terminals are 403 and 404. Therefore, the current flow for resistor network 400 can be calculated by summing the current through the source terminals 401, 402, and 405 as follows:

$$I_1 + I_2 + I_5$$

or summing the current through the drain terminals 403 and 404 as follows:

$$I_3 + I_4$$

At 216 of FIG. 2, the process then determines the equivalent resistance value for the entire resistor network based upon the values previously determined in the process. The equivalent resistance value is determined by dividing the change in power by the current flow through the network squared as followed:

$$R_{eq} = \frac{\Delta P}{I^2} \qquad \text{Equation 4}$$

This value $R_{eq}$ is the effective resistance for the entire resistor network.

One advantage of this approach is that the cost of calculation is invariant, determined solely by the number of terminals, and not by the number of parasitics elements in the network, regardless of the size of the network. Therefore, this approach is very scalable and works well even if applied to a network containing a large number of parasitic elements.

Figure 3:
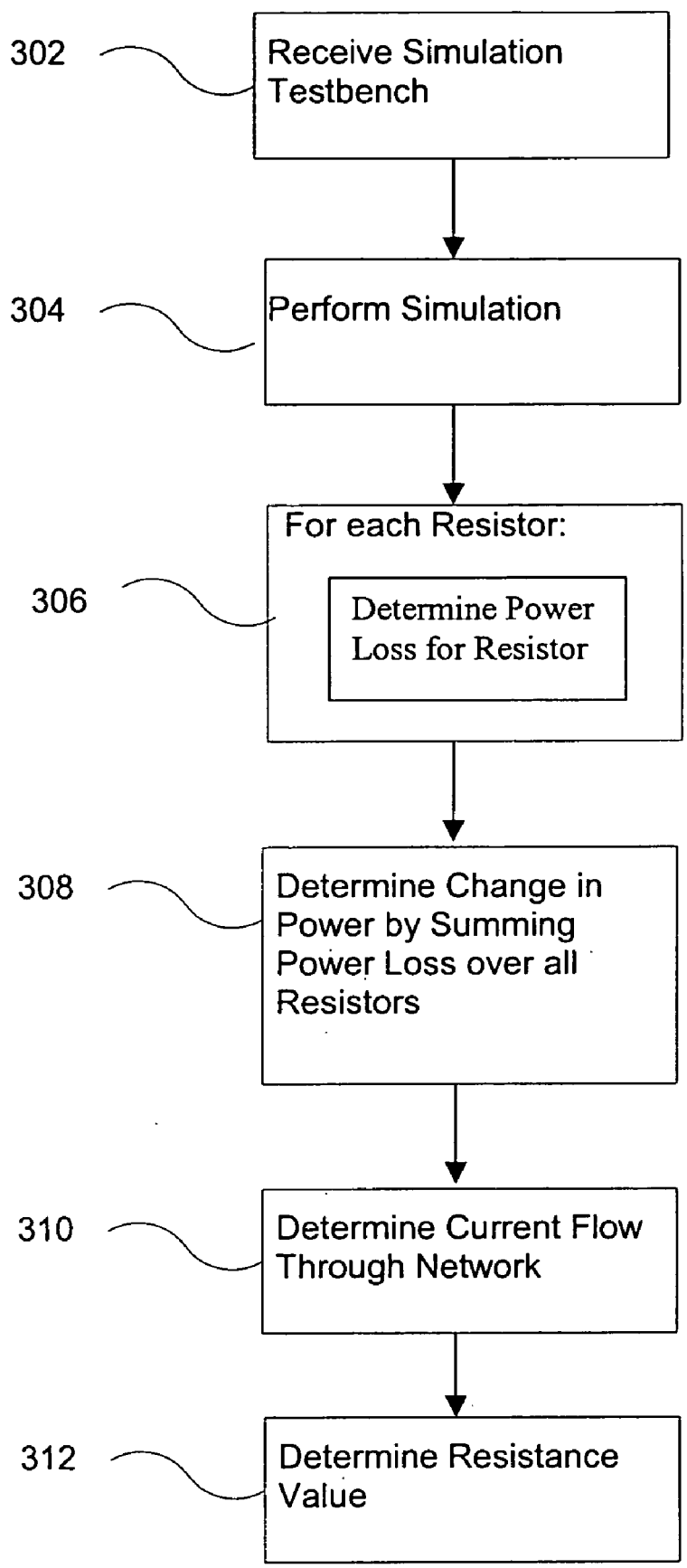
FIG. 3 shows a flowchart of a process for calculating an effective resistance value based upon measurements at internal nodes according to an embodiment of the invention.

FIG. 3 shows a flowchart of an alternative approach to determine the change in power, to sum the power loss for each resistor in the network according to an embodiment of the invention. This approach assumes that the process has access to each resistor in the network and can either obtain the power loss via the simulator directly, or can calculate the power loss as the voltage drop across the resistor divided by the current flowing through it.

Similar to the process of FIG. 2, the present process of FIG. 3 begins by receiving a simulation testbench that is appropriate for the resistor network that is presently under analysis (302). At 304, simulation is performed upon the resistor network using the simulation testbench that was received at 302. This action runs an analog DC simulation (if the context in which the invention is used involves an analog designer seeking to analyze an analog circuit).

Based upon the simulation, the process determines the power loss for each resistor in the network (306). If this type of analysis is performed upon the example network 600 of FIG. 5, than this can be accomplished by simulating or actually measuring circuit values across each resistor within the network 600. The power loss through each resistor can be calculated by the following equations:

$$P_r = I_r^2 * R_r \qquad \text{Equation 5}$$

or $$P_r = (|V_{node1} - V_{node2}|) * I_r \qquad \text{Equation 6}$$

Equation 5 can be used if the resistance of each resistor in the network is known. With this equation, the power loss is determined by squaring the current through a resistor and multiplying the resultant value against the resistance value for the resistor. However, it is possible that some or all of the resistance values may not necessarily be obtained through simulation, making this approach more difficult to implement.

Equation 6 is performed by identifying a set of "nodes" for each resistor in the network. For example, in the example network 600 of FIG. 5, the portion of the network 600 defined by the resistor ra314 is associated with a first node 608 and a second node at terminal 4. The power loss for resistor ra314 is determined by subtracting the voltage at the node for terminal 4 from the voltage at node 608 and multiplying the resultant value against the current through resistor ra314 (i.e., power loss for resistor ra314= $(V_{node\_608} - V_{node\_4}) * I_{ra314}$). Similarly, the portion of the network 600 defined by resistor ra313 is associated with a first node 604 and a second node 608. The power loss for resistor ra313 is determined by subtracting the voltage at the node 608 from the voltage at node 604 and multiplying the resultant value against the current through resistor ra313 (i.e., power loss for resistor ra313= $(V_{node\_604} - V_{node\_608}) * I_{ra313}$). Each such resistor in network 600 is analyzed in a similar manner to determine the resistor power losses using equation 6.

At 308, the process determines the change in power in the network, or overall power loss, by summing the power loss over all resistors in the network as follows:

$$\Delta P = \Sigma P_r \qquad \text{Equation 7}$$

At 310, the process determines the overall current flow through the resistor network. To determine the network current I, Kirchoff's Current Law (KCL) is used. The overall current flow can be determined using an approach similar to that described with respect to action 214 of FIG. 2.

At 312 of FIG. 2, the process then determines the equivalent resistance value for the entire resistor network based upon the values previously determined in the process. The equivalent resistance value is determined by dividing the change in power by the current flow through the network squared, as previously described in Equation 4, which is reproduced as follows:

$$R_{eq} = \frac{\Delta P}{I^2} \qquad \text{Equation 4}$$

This value $R_{eq}$ is the effective resistance for the entire resistor network.

It is noted that the same technique for calculating the effective resistance could be used on a physical circuit board (PCB), where voltmeters and current meters could be used to directly determine the voltage/current at terminals, instead of a simulator.

Figure 6:
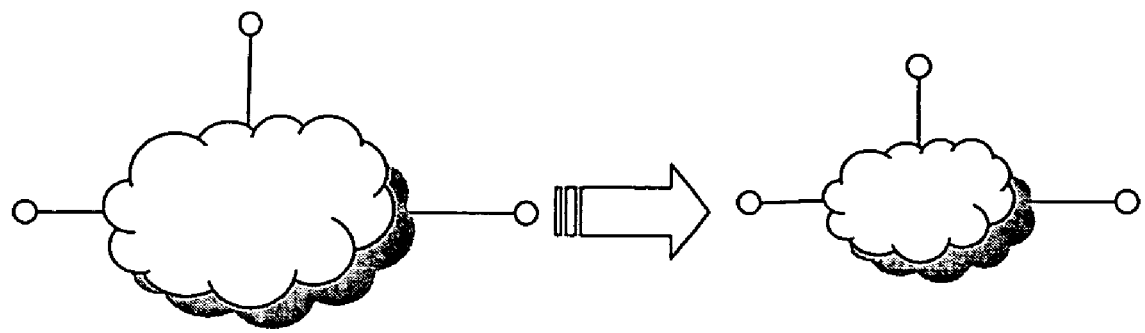
FIG. 6 illustrates a pictorial representation of a process for reducing a net according to an embodiment of the invention.

An optional step that can be performed is to first reduce the resistor network before performing simulation upon it. This optimization addresses a possible concern that running a DC simulation on a large parasitic network under certain circumstances may be expensive and/or impractical. As shown in FIG. 6, rather than simulating the full parasitic network, a reducer is called on the network before simulating with the assumption that the time to reduce and simulate will be less than simulating the original netlist. This approach may not be as accurate as simulating the entire un-reduced network, but may reduce the performance impact of running the DC simulation. Mathematical and/or Matrix-based RC reduction can be performed on the resistor network to produce a reduced RC network. If using a mathematical reducer, a further enhancement could be to supply an operating frequency to the reducer to enhance the accuracy of the results. This reduced network will have fewer resistors or nodes, but will preserve the number of external terminals on the network.

SYSTEM ARCHITECTURE OVERVIEW

Figure 7:
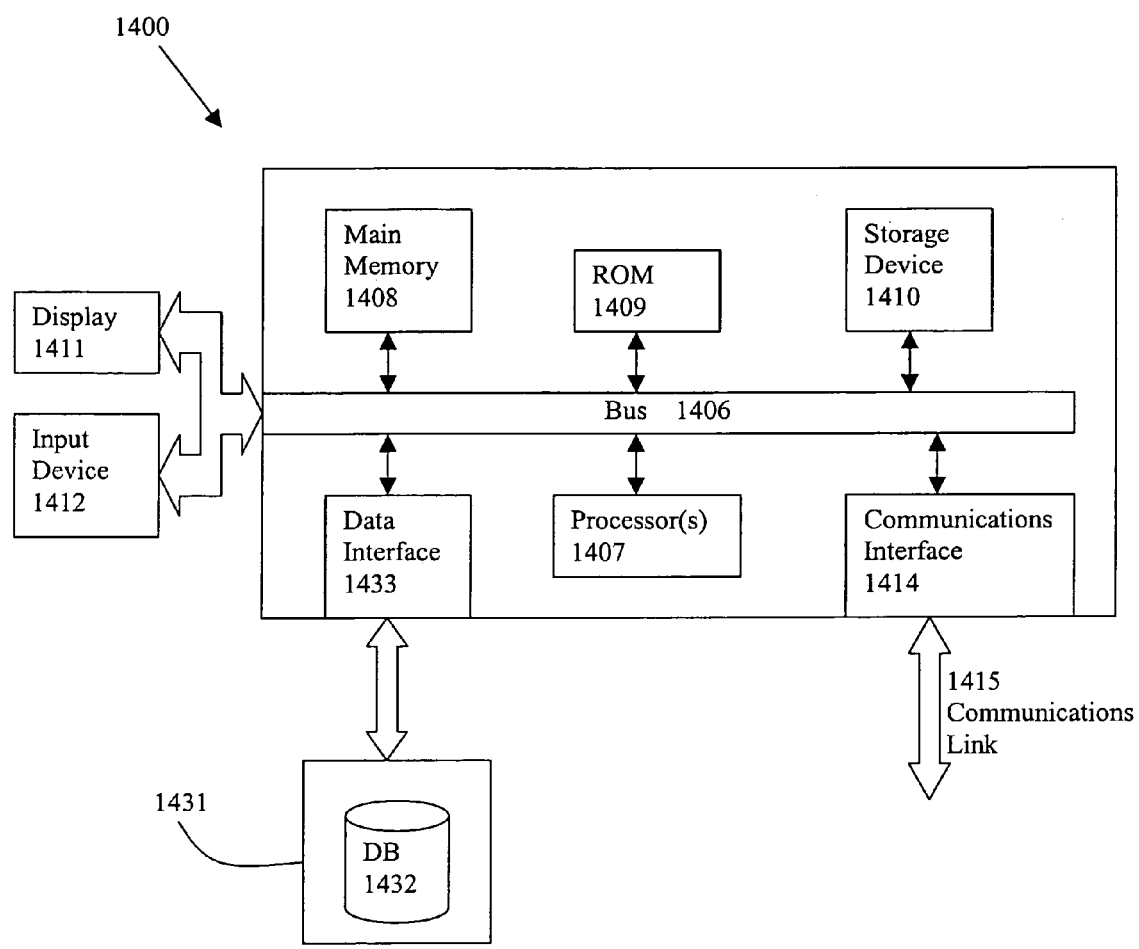
FIG. 7 is a diagram of a computer system with which the present invention can be implemented.

The execution of the sequences of instructions required to practice the invention may be performed in embodiments of the invention by a computer system 1400 as shown in FIG. 7. In an embodiment of the invention, execution of the sequences of instructions required to practice the invention is performed by a single computer system 1400. According to other embodiments of the invention, two or more computer systems 1400 coupled by a communication link 1415 may perform the sequence of instructions required to practice the invention in coordination with one another. In order to avoid needlessly obscuring the invention, a description of only one computer system 1400 will be presented below; however, it should be understood that any number of computer systems 1400 may be employed to practice the invention.

A computer system 1400 according to an embodiment of the invention will now be described with reference to FIG. 7, which is a block diagram of the functional components of a computer system 1400 according to an embodiment of the invention. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments of the invention, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment of the invention, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for calculating a resistance value for a resistor network, comprising:

identifying a resistor network of resistors to analyze, the resistor network having a plurality of resistors, the resistor network having greater than two terminals;

performing simulation upon the resistor network;

determining circuit values based upon results of performing simulation upon the resistor network;

determining a current flow through the resistor network based upon the circuit values;

determining a power loss value for the resistor network based upon the circuit values;

determining the resistance value for the resistor network based upon the power loss value and the current flow; and storing at least the resistance value.

2. The method of claim 1 in which the circuit values are determined at the terminals.

3. The method of claim 2 in which the act of determining the circuit values comprises:
   determining voltage at a terminal;
   determining current at a terminal; and
   determining current polarity of a terminal.

4. The method of claim 3 in which current sourcing terminals and current sink terminals are identified based upon the current polarity that has been determined for each of the terminals.

5. The method of claim 4 in which the current flow through the resistor network is determined by summing current through either all current sourcing terminals or through all current sink terminals.

6. The method of claim 4 further comprising:
   determining source power based upon circuit values for the current sourcing terminals; and
   determining drain power based upon circuit values for the current sink terminals.

7. The method of claim 5 in which source power is determined by summing the power at all current sourcing terminals and drain power is determined by summing the power at all current sink terminals, wherein power at a terminal is determined as a product of the voltage and current at each terminal.

8. The method of claim 7 in which the power loss value comprises a difference value between source power and drain power.

9. The method of claim 1 in which the circuit values are determined at each of the resistors.

10. The method of claim 9 further comprising:
    determining a power loss for each resistor.

11. The method of claim 10 in which the power loss for a resistor is determined using the following equation:

$$P_r = I_r^2 R_r$$

where represents $I_r$ the current through the resistor, $R_r$ represents the resistance for the resistor, and $P_r$ represents the power loss.

12. The method of claim 10 in which the power loss is determined by calculating the voltage at both first and second nodes of a resistor.

13. The method of claim 12 in which the power loss for a resistor is determined using the following equation:

$$P_r = (|V_{node1} - V_{node2}|) * I_r$$

where represents $I_r$ the current through the resistor, Vnode1 represents the voltage at the first node for the resistor, $V_{node2}$ represents the voltage at the second node for the resistor, and $P_r$ represents the power loss.

14. The method of claim 10 further comprising:
    determining the power loss value by summing the power loss for all of the resistors in the resistor network.

15. The method of claim 1 further comprising the act of receiving a simulation testbench, the simulation testbench used to perform the act of performing simulation upon the resistor network.

16. The method of claim 15 in which mathematical or matrix-based reduction is performed upon the resistor network.

17. The method of claim 1 in which the resistor network is reduced before simulation.

18. The method of claim 17 in which an operating frequency is supplied to the reduction logic.

19. The method of claim 1 in which the act of determining the resistance value for the resistor network is determined using the following equation:

$$R_{eq} = \frac{\Delta P}{I^2}$$

where $\Delta P$ represents the power loss value, I represents the current flow, and $R_{eq}$ represents the resistance value.

20. A method for calculating a resistance value for a resistor network, comprising:
    receiving circuit description data which describes a circuit design that includes a resistor network having a plurality of resistors, the resistor network having greater than two terminals, the plurality of resistors comprising series and parallel combinations;
    determining a resistance value that describes substantially the resistance of the resistor network without shorting any of the greater than the two terminals together; and
    storing at least the resistance value,
    wherein the act of determining the resistance value further comprises:
        calculating power loss in the resistor network;
        calculating current flow through the network; and
        calculating the resistance value from the power loss and current flow.

21. The method of claim 20 further comprising:
    summing resistor power loss for each resistor in the network.

22. The method of claim 21 wherein the act of summing resistor power loss further comprises:
    calculating power at both terminals of a resistor; and
    calculating a power difference.

23. The method of claim 20 further comprising:
    summing power for all the current sourcing terminals of the network; and
    summing the power for all the current sinking terminals of the network.

24. The method of claim 23 further comprising:
    calculating power loss based upon a difference between summed power for the current sourcing terminals and summed power for the current sinking terminals.

25. The method of claim 20 in which the act of calculating power loss comprises:
    testing current at a terminal;
    testing voltage at the terminal; and
    calculating power from the product of the current and voltage.

26. The method of claim 20 in which the act of calculating current comprises:
    summing the currents for all the current sources or summing the currents for all the current sinks.

27. The method of claim 26 in which identification of current sourcing terminals and current sinking terminals comprises:
    testing the current polarity at each terminal; and
    partitioning terminals into a collection of current sources and a collection of current sinks according to polarity.

28. A method for calculating a resistance value for a resistor network, comprising:
    receiving circuit description data which describes a circuit design that includes a resistor network having a plurality of resistors, the resistor network having greater than two terminals, the plurality of resistors comprising series and parallel combinations;

determining a resistance value that describes substantially the resistance of the resistor network without shorting any of the greater than the two terminals together;
storing at least the resistance value; and
simulating the execution of the circuit design.

29. A method for calculating a resistance value for a resistor network, comprising:
receiving circuit description data which describes a circuit design that includes a resistor network having a plurality of resistors, the resistor network having greater than two terminals, the plurality of resistors comprising series and parallel combinations;
determining a resistance value that describes substantially the resistance of the resistor network without shorting any of the greater than the two terminals together;
storing at least the resistance value; and
executing a physical realization of the circuit design so that currents and voltages are measured by physical instruments.

30. A method for calculating a resistance value for a resistor network, comprising:
receiving circuit description data which describes a circuit design that includes a resistor network having a plurality of resistors, the resistor network having greater than two terminals, the plurality of resistors comprising series and parallel combinations;
determining a resistance value that describes substantially the resistance of the resistor network without shorting any of the greater than the two terminals together; and
storing at least the resistance value,
wherein the resistor network is reduced before simulation.

31. The method of claim 30 in which mathematical or matrix-based reduction is performed upon the resistor network.

32. The method of claim 31 in which an operating frequency is supplied to the reduction logic.

33. A method for calculating a resistance value for a resistor network, comprising:
receiving circuit description data which describes a circuit design that includes a resistor network having a plurality of resistors, the resistor network having greater than two terminals, the plurality of resistors comprising series and parallel combinations;
determining a resistance value that describes substantially the resistance of the resistor network without shorting any of the greater than the two terminals together; and
storing at least the resistance value,
wherein the cost of calculation for determining the resistance value is based upon the number of terminals in the resistor network, and not by the number of parasitics elements in the resistor network.

34. The method of claims 28, 29, 30 or 33, wherein determining the resistance value comprises:
calculating power loss in the resistor network;
calculating current flow through the network; and
calculating the resistance value from the power loss and current flow.

35. The method of claim 34 further comprising:
summing resistor power loss for each resistor in the network by calculating power at both terminals of a resistor and calculating a power difference.

36. The method of claim 34 further comprising:
summing power for all the current sourcing terminals of the network; and
summing the power for all the current sinking terminals of the network.

37. The method of claim 36, further comprising calculating power loss based upon a difference between summed power for the current sourcing terminals and summed power for the current sinking terminals.

38. The method of claim 34, wherein calculating power loss comprises:
testing current at a terminal;
testing voltage at the terminal; and
calculating power from the product of the current and voltage.

39. The method of claim 34, wherein the act of calculating current comprises:
summing the currents for all the current sources or summing the currents for all the current sinks.

40. The method of claim 39, wherein identification of current sourcing terminals and current sinking terminals comprises:
testing the current polarity at each terminal; and
partitioning terminals into a collection of current sources and a collection of current sinks according to polarity.

41. The method of claims 1, 20, 28, 29, 30 or 33, wherein at least the resistance value is stored in a memory device.

42. A computer program product comprising a computer usable medium having executable code to execute a process for calculating a resistance value for a resistor network, the process comprising:
identifying a resistor network of resistors to analyze, the resistor network having a plurality of resistors, the resistor network having greater than two terminals;
performing simulation upon the resistor network;
determining circuit values based upon results of performing simulation upon the resistor network;
determining a current flow through the resistor network based upon the circuit values;
determining a power loss value for the resistor network based upon the circuit values; and
determining the resistance value for the resistor network based upon the power loss value and the current flow.

43. The computer program product of claim 42 further comprising:
summing resistor power loss for each resistor in the network by calculating power at both terminals of a resistor and calculating a power difference.

44. The computer program product of claim 42 further comprising:
summing power for all the current sourcing terminals of the network; and
summing the power for all the current sinking terminals of the network.

45. A system for calculating a resistance value for a resistor network, comprising:
logic for identifying a resistor network of resistors to analyze, the resistor network having a plurality of resistors, the resistor network having greater than two terminals;
logic for performing simulation upon the resistor network;
logic for determining circuit values based upon results of performing simulation upon the resistor network;
logic for determining a current flow through the resistor network based upon the circuit values;
logic for determining a power loss value for the resistor network based upon the circuit values; and
logic for determining the resistance value for the resistor network based upon the power loss value and the current flow.

46. The system of claim 45 further comprising:
logic for summing resistor power loss for each resistor in the network by calculating power at both terminals of a resistor and calculating a power difference.

47. The system of claim 45 further comprising:
logic for summing power for all the current sourcing terminals of the network; and
logic for summing the power for all the current sinking terminals of the network.

48. A computer program product comprising a computer usable medium having executable code to execute a process for calculating a resistance value for a resistor network, the process comprising:
receiving circuit description data which describes a circuit design that includes a resistor network having a plurality of resistors, the resistor network having greater than two terminals, the plurality of resistors comprising series and parallel combinations;
determining a resistance value that describe substantially the resistance of the resistor network without shorting any of the greater than the two terminals together; and
storing at least the resistance value,
wherein determining the resistance value includes:
calculating power loss in the resistor network;
calculating current flow through the network; and
calculating the resistance value from the power loss and current flow.

49. The computer program product of claim 48, wherein determining the resistance value comprises:
calculating power loss in the resistor network;
calculating current flow through the network; and
calculating the resistance value from the power loss and current flow.

50. The computer program product of claim 49 further comprising:
summing resistor power loss for each resistor in the network by calculating power at both terminals of a resistor and calculating a power difference.

51. The computer program product of claim 49 further comprising:
summing power for all the current sourcing terminals of the network; and
summing the power for all the current sinking terminals of the network.

52. The computer program product of claim 48, wherein at least the resistance value is stored in a memory device.

53. A system for calculating a resistance value for a resistor network, comprising:
logic for receiving circuit description data which describes a circuit design that includes a resistor network having a plurality of resistors, the resistor network having greater than two terminals, the plurality of resistors comprising series and parallel combinations; and
logic for determining a resistance value that describe substantially the resistance of the resistor network without shorting any of the greater than the two terminals together,
wherein the logic for determining the resistance value includes:
logic for calculating power loss in the resistor network;
logic for calculating current flow through the network; and
logic for calculating the resistance value from the power loss and current flow.

54. The system of claim 53, wherein determining the resistance value comprises:
calculating power loss in the resistor network;
calculating current flow through the network; and
calculating the resistance value from the power loss and current flow.

55. The system of claim 54 further comprising:
summing resistor power loss for each resistor in the network by calculating power at both terminals of a resistor and calculating a power difference.

56. The system of claim 54 further comprising:
summing power for all the current sourcing terminals of the network; and
summing the power for all the current sinking terminals of the network.

* * * * *